(12) United States Patent
Zhou et al.

(10) Patent No.: US 9,817,315 B2
(45) Date of Patent: Nov. 14, 2017

(54) SYSTEM AND METHOD FOR SUPPLYING AND DISPENSING BUBBLE-FREE PHOTOLITHOGRAPHY CHEMICAL SOLUTIONS

(71) Applicant: Taiwan Semiconductor Manufacturing Co., Ltd., Hsin-Chu (TW)

(72) Inventors: Wen-Zhan Zhou, Zhubei (TW); Heng-Jen Lee, Baoshan Township (TW); Hsu-Yuan Liu, Zhudong Township (TW); Yu-Chen Huang, Toufen Township (TW); Cheng-Han Wu, Taichung (TW); Shih-Che Wang, Hsin-Chu (TW); Ho-Yung David Hwang, Chu Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 275 days.

(21) Appl. No.: 14/208,529

(22) Filed: Mar. 13, 2014

(65) Prior Publication Data
US 2015/0261089 A1 Sep. 17, 2015

(51) Int. Cl.
*G03F 7/16* (2006.01)
*B67D 7/02* (2010.01)
(Continued)

(52) U.S. Cl.
CPC ............. *G03F 7/16* (2013.01); *B67D 7/0294* (2013.01); *B67D 7/36* (2013.01); *B67D 7/78* (2013.01);
(Continued)

(58) Field of Classification Search
None
See application file for complete search history.

(56) References Cited

U.S. PATENT DOCUMENTS

| 6,648,201 B1 | 11/2003 | Marinaro et al. |
| 2009/0314798 A1 | 12/2009 | Hovinen et al. |

(Continued)

FOREIGN PATENT DOCUMENTS

| KR | 100780936 B1 | 12/2007 |
| KR | 20110068389 A | 6/2011 |

OTHER PUBLICATIONS

English translation of Korean Office Action dated Feb. 20, 2016 for co-pending Korean Application No. 10-2014-0166587.
(Continued)

*Primary Examiner* — Dah-Wei D Yuan
*Assistant Examiner* — Jethro M Pence
(74) *Attorney, Agent, or Firm* — Eschweiler & Potashnik, LLC

(57) ABSTRACT

A photolithography system includes a variable-volume buffer tank, a dispensing system connected to the buffer tank, and a valve configured to release gas from a head space of the buffer tank while blocking the release of liquid from the head space. A storage container has an opening at the bottom and drains to the buffer tank through that opening. The buffer tank has a storage capacity sufficient to receive the full contents of the storage container. The system supplies chemical solutions to the dispensing system while keeping the chemical solutions from contact with air and other gases.

20 Claims, 3 Drawing Sheets

(51) Int. Cl.
*B67D 7/36* (2010.01)
*B67D 7/78* (2010.01)
(52) U.S. Cl.
CPC .. *Y10T 137/0318* (2015.04); *Y10T 137/86187* (2015.04)

(56) References Cited

U.S. PATENT DOCUMENTS

| | | | |
|---|---|---|---|
| 2010/0058985 A1* | 3/2010 | Kim | G03F 7/16 118/720 |
| 2011/0091821 A1 | 4/2011 | Kobayashi | |
| 2013/0112628 A1* | 5/2013 | Yoshihara | G03F 7/0022 210/767 |
| 2013/0193164 A1 | 8/2013 | Tom et al. | |

OTHER PUBLICATIONS

Iwaki "Photoresist Dispensing Systems PDS Series" Product Sheet, Aug. 2005. 8 Pages.

* cited by examiner

SYSTEM AND METHOD FOR SUPPLYING AND DISPENSING BUBBLE-FREE PHOTOLITHOGRAPHY CHEMICAL SOLUTIONS

BACKGROUND

The present disclosure relates to photolithography systems and systems and methods for supplying chemicals to photolithography systems.

An essential tool for manufacturing integrated circuits with high component device densities is photolithography. Photolithography involves forming thin coatings. One of these coatings is a photoresist. Another commonly used coating is a bottom anti-reflective coating (BARC). These coatings are formed from liquid chemical solutions. The chemical solutions are held in reservoirs from which the chemical solutions are dispensed as needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
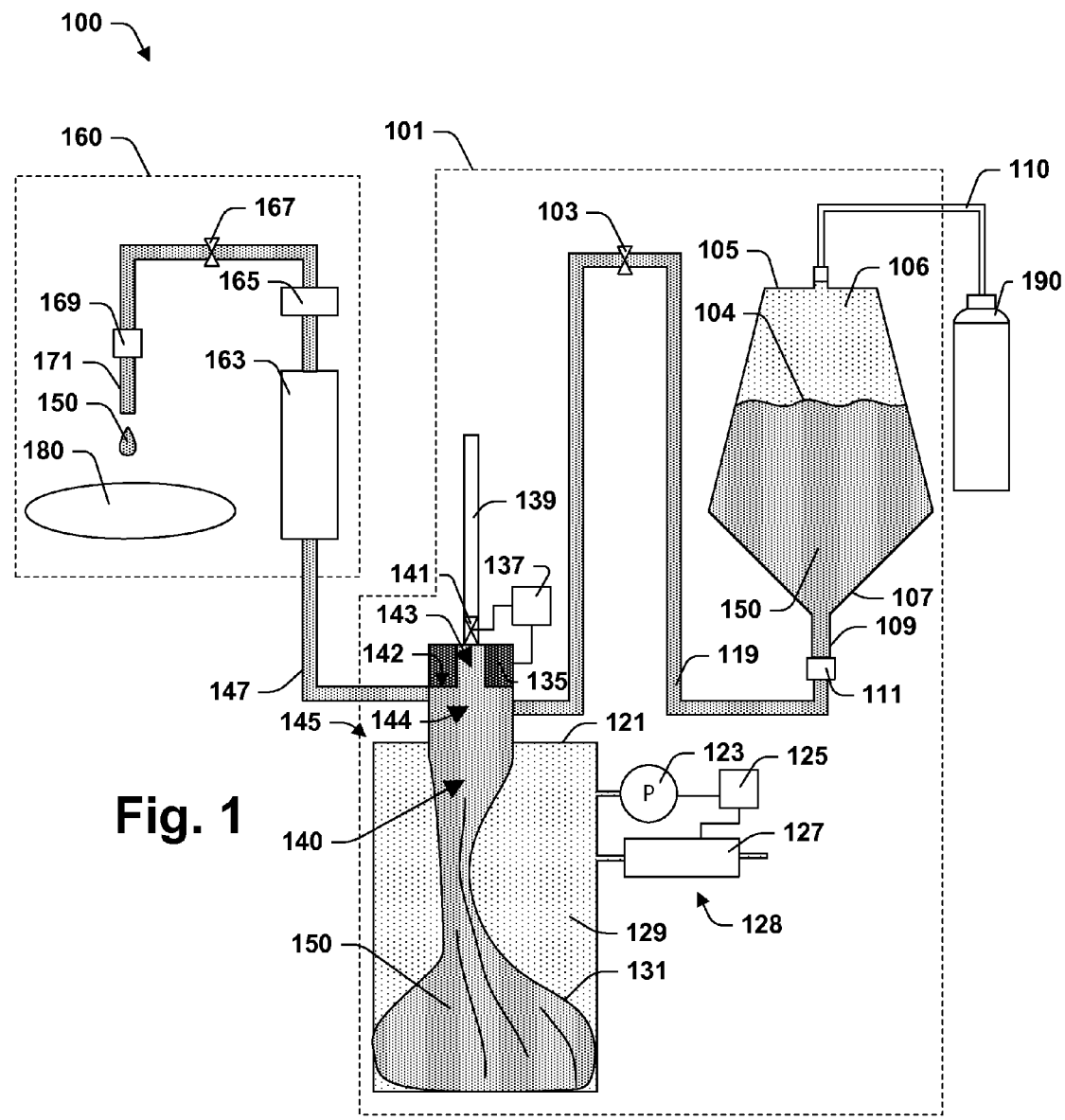
FIG. 1 is a photolithography system in accordance with some embodiments of the present disclosure

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It has been observed that bubbles and contaminants in photolithography chemical solutions can lead to device defects. Air in the head space over a photolithography chemical solution reservoir has been found to be a source of contamination. Nitrogen filling the head space over a photolithography chemical reservoir has been found to be a cause of bubbles. The present disclosure provides systems and methods for supplying photolithography chemical solutions with little or no exposure to air and limited exposure to and contact with a pure nitrogen atmosphere that can cause bubbles.

The equilibrium concentration of nitrogen in a liquid solution is approximately proportional to the partial pressure of nitrogen in contact with that solution. If a liquid solution is stored under pure nitrogen at one atmosphere pressure for a sufficient period of time, it will absorb nitrogen until the nitrogen concentration in solution is in equilibrium with nitrogen gas at one atmosphere. If the liquid solution is then released into ambient air at one atmosphere, nitrogen will desorb until its concentration has decreased approximately 22%. Air is only 78% nitrogen. The desorbing nitrogen can form bubbles, particularly if it was absorbed to equilibrium with nitrogen gas at a pressure above one atmosphere or at a temperature above ambient. In some systems provided by the present disclosure, photolithography chemical solutions are exposed to a pure nitrogen atmosphere, but the exposure time and contact area are limited to prevent nitrogen absorbing into the solution to a concentration near equilibrium.

According to some embodiments of the present disclosure, a variable-volume buffer tank provides a reservoir for a photolithography chemical solution dispensing system. The buffer tank provides a reservoir from which a chemical solution can be dispensed as needed without requiring a head space filled with gas. In some of these embodiments, the buffer tank includes a venting system to release any gas that make its way into the buffer tank or emerges from the liquid in the buffer tank as bubbles. In some of these embodiments, the buffer tank is maintained at a positive pressure to facilitate the complete removal of any gas.

According to some embodiments of the present disclosure, a variable-volume buffer tank receives the full contents of a chemical solution storage container with each refill operation, which prevents the chemical solution from being contaminated by air or saturated with nitrogen while in a partially full storage container. The buffer tank is sized accordingly.

FIG. 1 illustrates a photolithography system 100 according to some embodiments of the present disclosure. Photolithography system 100 includes a photolithography chemical solution dispensing system 160 and a photolithography chemical supply system 101. Supply system 101 is itself an example according to some embodiments of the present disclosure. Supply system 101 includes a variable-volume buffer tank 145 and chemical solution storage containers 105. Buffer tank 145 provides a reservoir of a chemical solution 150 and makes chemical solution 150 available on demand to dispensing system 160 through a fixed conduit 147. Storage containers 105 replenish buffer tank 145 through a conduit 119.

Dispensing system 160 dispenses chemical solution 150 onto the surfaces of wafers 180. Chemical solution 150 is a photolithography chemical solution. A photolithography chemical solution is a liquid chemical solution suitable for spin coating onto wafers 180 within a photolithography process. In most embodiments, photolithography system 100 includes a spin coater (not shown). Chemical solution 150 can be, for example, a photoresist solution, a bottom anti-reflective coating (BARC) solution, or a primer solution such as a solution of primer that promotes adhesion between a wafer surface and a photoresist.

In some embodiments, dispensing system 160 includes a pump 163. In some embodiments, dispensing system 160 includes other components commonly included in a photoresist dispensing system. These other components can include, for example, a filter 165, a valve 167, and a suck-back valve 169. Suck-back valve 169 is a valve functional to remove chemical solution 150 from dispensing tip 171 between dispensing operations. Dispensing system 160 draws chemical solution 150 from buffer tank 145 through conduit 147.

Buffer tank 145 includes a container space 140 having one or more movable boundaries, whereby the volume of the container space 140 can increase as fluid is added and decrease as fluid is removed. FIG. 1 provides an example in accordance with embodiments where a collapsible liner 131 provides movable boundaries for container space 140. Container space 140 of FIG. 1 includes a rigid upper container space 144 and a head space 143. Collapsible liner 131 is a bag-like container. In some embodiments, collapsible liner 131 is gusseted. Collapsible liner 131 can be formed of any suitable material. A suitable material can be, for example, polytetrafluoroethylene (PTFE). Variable-volume buffer tank 145 further includes a rigid shell 129. Rigid shell 129 supports liner 131. Shell 129 can be formed of a rigid material, such as stainless steel or high density polyethylene (HDPE).

Figure 2:
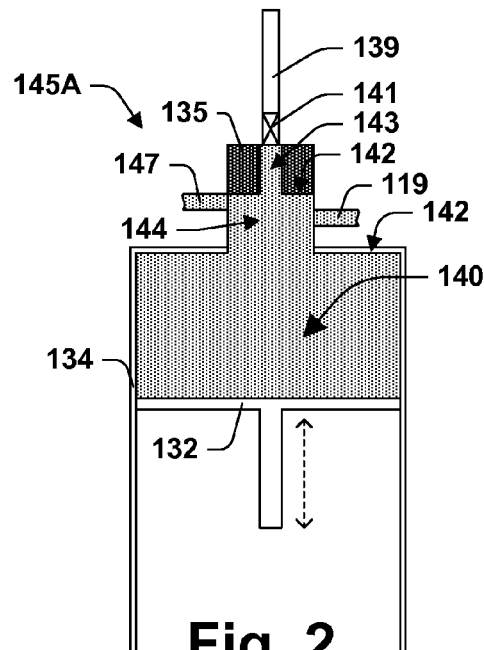
FIG. 2-5 are variable-volume buffer tanks in accordance with various embodiments.
Figure 3:
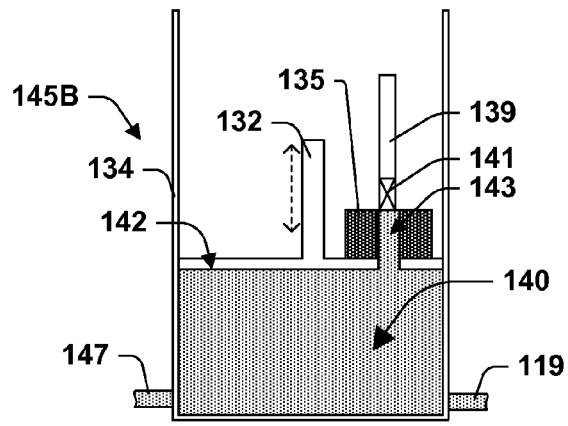
Figure 4:
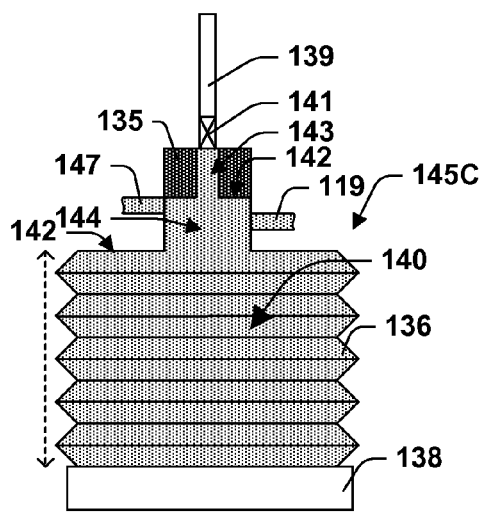
Figure 5:
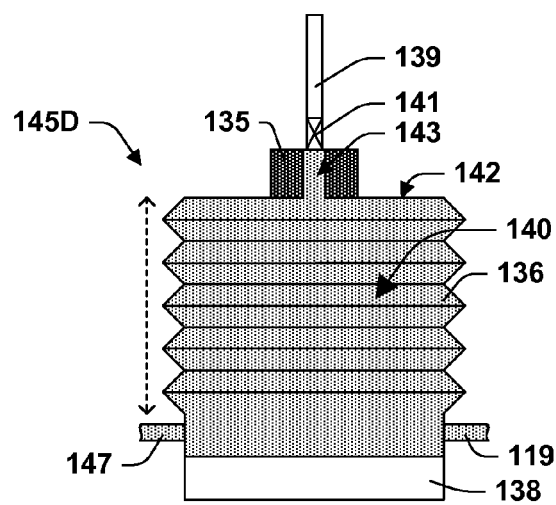

FIGS. 2-5 provide additional examples of designs for variable-volume buffer tank 145. FIGS. 2 and 3 illustrate variable-volume buffer tanks 145A and 145B in accordance with some embodiments in which a variable-volume container space 140 is formed in part by a piston 132 within a cylinder 134. FIGS. 4 and 5 illustrate variable-volume buffer tanks 145C and 145D in accordance with some embodiments in which a variable-volume container space 140 is formed in part by a flexible material having accordion pleats 136. An advantage of these designs in comparison to ones featuring a collapsible liner 131 is that they have fewer folds in which bubbles can be trapped.

In some embodiments, a variable-volume buffer tank 145 is equipped with a venting system 128 for releasing gases from head space 143, whereby the contents of container space 140 within buffer tank 145 are at all times entirely or nearly entirely liquid. Venting system 128 includes a valve 141 that substantially prevents the contents of buffer tank 145 from coming into communication with ambient air. In some embodiments upper surfaces 142 of container space 140 are sloped toward head space 143 proximate venting valve 141 to facilitate the migration of any bubbles within container space 140 to head space 143 where they can be vented. Venting valve 141 release gas into a vent pipe 139 or directly into the atmosphere.

In some embodiments, venting valve 141 is a degassing valve. A degassing valve is a valve designed to allow the passage of gas while blocking the passage of liquid. In some embodiments, a degassing valve includes a float and the valve closes when a liquid raises the float. In some embodiments, a degassing valve 141 is of a type that is functional to selectively vent gases even when pressures in head space 143 are greater than pressures in vent pipe 139.

In some embodiments, venting valve 141 is an electronically controlled valve. An electronically controlled valve is operated by a controller 137 as illustrated in FIG. 1. Controller 137 can take input from a bubble detector 135. Bubble detector 135 detects bubbles in head space 143. In some embodiments, bubble detector 135 uses ultrasound to detect the presence of bubbles in head space 143. When bubbles are detected, controller 137 opens venting valve 141. When bubbles are no longer detected or after a short period, controller 137 closes venting valve 141. Mechanical degassing valves are simpler than electronically controller valves, but an electronically controlled valve can provide the most thorough venting.

In some embodiments, buffer tank 145 maintains chemical solution 150 within container space 140 at a positive pressure. A positive pressure is a pressure in excess of atmospheric and can facilitate venting of bubbles. In some embodiments, a positive pressure is maintained by controlling an amount of a fluid 129 in the space between rigid shell 121 and liner 131. In some embodiments, a positive pressure is maintained by applying a mechanical force against the outside of container space 140. A mechanical force can be applied, for example, through the piston 132 shown in FIGS. 2 and 3 or by the platform 138 shown in FIGS. 4 and 5. Examples of mechanical forces includes forces supplied by springs, hydraulics, or counter weights.

In some embodiments, a positive pressure in container space 140 is maintained passively. A passive system can operate through gravity. In the example of FIG. 3, the weight of piston 132 can maintain a positive pressure in container space 140. The tendency of gravity to flatten variable-volume buffer tank 145C or 145D of FIGS. 4 and 5 can maintain a positive pressure in the container space 140 of those examples.

In some embodiments, buffer tank 145 includes a pressure-regulating system 128. FIG. 1 provides an example. Pressure regulating system 128 includes a pressure gauge 123 and a controller 125. In some embodiments, pressure regulating system 128 regulates pressure by adding or removing fluid 129 from the space between rigid shell 121 and liner 131 using a pump 127.

Buffer tank 145 connects to storage containers 105 through a conduit 119. In some embodiments, the conduit 147 that connects buffer tank 145 to dispensing system 160 and conduit 119 exit container space 140 at a height below head space 143. This design can improve venting of head space 140. In some embodiments, conduit 147 taps container space 140 proximate its upper end as shown in the examples of FIGS. 1, 2, and 4. This design can provide a more consistent pressure head for pump 163. In some other embodiments, conduit 147 taps container space 140 proximate its lower end as shown in the examples of FIGS. 3 and 5. This design can reduce the probability that bubble will be entrained in chemical solution 150 when it is supplied to dispensing system 160. Depending on other design choices, one or the other configuration for conduit 147 can facilitate expansion and contraction of container space 140 by minimizing tubing within container space 140. Similar considerations apply, and there are corresponding embodiments, for connecting conduit 119 to buffer tank 145. In some embodiments, the lengths of any tubes within container space 140, such as tubes connecting with conduits 119 or 147, are all less than half the height of container space 140.

Storage containers 105 are detachable from supply system 101. They are replaced when more of chemical solution 150 is required in buffer tank 145. Storage containers 105 can be attached to the conduit 119 that connects storage containers 105 to buffer tank 145 through a coupling 111. In some embodiments, conduit 119 includes a valve 103 that prevents backflow from buffer tank 145 when a storage container 105 is detached from coupling 111. In some embodiments, valve 103 is a check valve. In some embodiments, valve 103 includes a mechanism for releasing gas trapped in conduit 119.

Whereas storage containers 105 are detachable from photolithography chemical supply system 101, buffer tank 145 can remain permanently connected to dispensing system 160. Accordingly, in some embodiments conduit 147 provides a fixed connection between buffer tank 145 and dispensing system 160.

Buffer tank 145 is designed with sufficient capacity to receive and hold the contents of a storage container 105 filled to capacity. In most embodiments, storage containers 105 have a capacity that is greater than 3 liters. Accordingly, in most embodiments, buffer tank 145 has a storage capacity greater than 3 liters. Storage capacity refers to overall capacity as opposed to free capacity at a given time, which depends on the amount of chemical solution 150 currently in container space 140. The storage capacity of container space 140 corresponds to its maximum volume.

In some embodiments, storage containers 105 are designed to drain from the bottom. More specifically, in some embodiment storage containers 105 have an opening 109 at and through their bottoms through which chemical solution 150 can be drained. In some embodiments, storage containers 105 have a bottom surface 107 sloping inward toward a bottom-draining opening 109. Bottom draining can reduce the chance for entraining bubbles. Bottom draining can reduce agitation at an interface 104 between chemical solution 150 and gas in head space 106, reducing rates of absorption from gas in head space 106.

In most embodiments, storage containers 105 are configured to be drained without exposing chemical solution 150 to air. In some embodiments, storage containers 105 are rigid containers. In some embodiments, storage containers 105 are connected by a line no to a nitrogen storage cylinder 190, which allows head space 106 to fill with nitrogen as chemical solution 150 drains. In some embodiments, storage containers 105 are elevated relative to buffer tank 145 allowing drainage to be gravity driven. In some embodiments, nitrogen storage cylinder 190 is configured to apply a positive pressure in head space 106 sufficient to drive chemical solution 150 out of storage container 105 and into buffer tank 145. In some embodiments, storage container 105 is a variable-volume container. In some of these embodiments, storage container 105 has one of the variable volume designs as described for buffer tank 145. Storage container 105 has corresponding embodiments including embodiments corresponding to the various ways in which pressure can be applied.

In most embodiments, chemical solution 150 is stored for days, weeks, or months in storage containers 105. In some embodiments, storage containers 105 are containers in which chemical solution 150 is shipped. A manufacturer may be requested to supply chemical solution 150 in storage containers 105 designed for use in photolithography system 100, whereby there is no risk of contaminating chemical solution 150 prior to attaching storage containers 105 to supply system 101.

Figure 6:
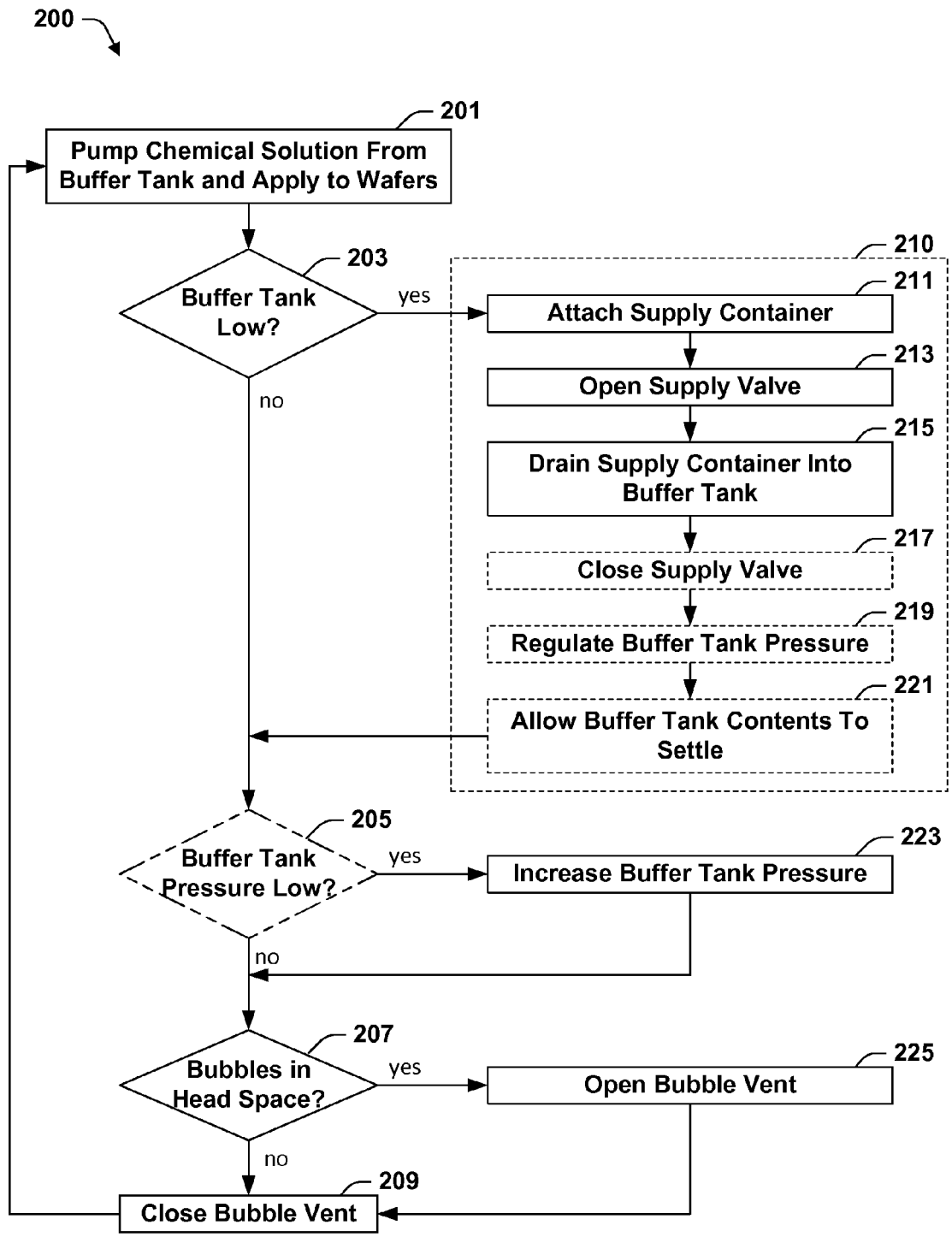
FIG. 6 is a flow chart of a method of supplying a chemical solution to a photolithography system in accordance with some embodiments.

FIG. 6 provides a flow chart of a method 200 according to some embodiments of the present disclosure. Method 200 is a method for supplying a chemical solution 150 to a photolithography system 100. Method 200 includes act 201, which is pumping chemical solution 150 from buffer tank 145 and applying it to wafers 180. In some embodiments, chemical solution 150 is drawn from buffer tank 145 each time dispensing system 160 makes an application of chemical solution 150 to a wafer 180. The volume of the container space 140 decreases as chemical solution 150 is removed.

Act 203 is determining whether buffer tank 145 is in need of refill. In some embodiments, the amount of chemical solution in buffer tank 145 is determined by a sensor, such as a sensor detecting the height of a piston 132. In some embodiments, the amount of chemical solution in buffer tank 145 is determined by a controller 125 monitoring the amount of fluid 129 in a space between liner 131 and shell 121. In some embodiments, a low state of buffer tank 145 is inferred by a controller that monitors the amount of chemical solution 150 that has been dispensed by dispensing system 160 since the last refill of buffer tank 145. If a refill is needed, method 200 proceeds with a series of acts 210 constituting a refill operation.

In some embodiments, dispensing system 160 continues to operate during refill operation 210. In these embodiments, buffer tank 145 allows photolithography chemical supply system 101 to continuously supply dispensing system 160, which improves productivity.

Refill operation 210 begins with act 211, attaching a storage container 105 filled to capacity with chemical solution 150 to supply system 101. In some embodiments, this includes attaching conduit 119 to an opening 109 at the bottom of storage container 105 through a coupling 111. In some embodiments, act 211 includes attaching a nitrogen supply line 110 to the top of storage container 105.

Act 213 is opening a valve 103 that controls communication between storage container 105 and buffer tank 145. In some embodiments, act 213 is preceded by pressurizing the contents of storage container 105 to a hydrostatic pressure at or slightly above that in buffer tank 145. In some embodiments, act 213 is preceded by expelling gas trapped in conduit 119. A valve 103 can be designed for that function.

Act 215 is draining the contents of storage container 105 into buffer tank 145. In some embodiments, act 215 is a continuous operation through which storage container 105 drains steadily until empty. In some embodiments, act 215 is carried out from start to finish over a relatively short period. A short period is less than 5 minutes. By comparison, in most embodiments refill operation 210 is carried out less than once per hour. Once per day, for example.

Draining storage container 105 from a full condition to an empty condition over a short period minimizes the risk of contamination occurring or gases being absorbed into chemical solution 150 while storage container 105 is in a partially full state. In most embodiments, the volume of container space 140 increases by an amount that approximately equals the capacity of storage container 105 over the course of act 215.

Act 217 is closing valve 103, allowing the empty storage container 105 to be removed supply system 101 and allowing supply system 101 to be operated independently from storage container 105. Closing valve 103 prevents backflow from buffer tank 145. In some embodiments, valve 103 is a check valve and closes by itself. Accordingly, act 217 is optional.

Refill operation 210 continues with another optional act, adjusting the pressure in buffer tank 145. In some embodiments, the pressure in buffer tank 145 is regulated. In some of these embodiments, pressure regulation is suspended during refill operation 210. Act 219 may then be employed to adjust the pressure in buffer tank 145 to a desired pressure for supplying dispensing system 160.

Act 221 is another optional act. In some embodiments, dispensing system 160 is prevented from drawing from buffer tank 145 during refill operation 210. In some of these embodiments, act 221 is employed. Act 221 is continuing to suspend dispensing from buffer tank 145 though a waiting period during which the contents of container space 140 are allowed to settle and any bubbles that form or have been entrained are allowed time to rise into head space 143. In some embodiments, a waiting period is in the range from one minute to half an hour. In some embodiments, a waiting period is in the range from five minutes to fifteen minutes.

Method 200 continues with an option act 205, determining whether the pressure in buffer tank 145 is too low. If it is too low, method 200 proceeds with act 223, which is increasing the pressure in buffer tank 145. In some embodiments, acts 205 and 223 are replaced by a process control loop. In some embodiments, a process control loop can either increase or decrease the pressure in buffer tank 145. A desired pressure for buffer tank 145 is a positive pressure. In some embodiments, the pressure in buffer tank 145 is maintained in the range from 1.01 to 1.3 atm.

Method 200 continues with act 207, determining whether there are bubbles in head space 143. Act 207 is also optional. If there are bubbles in head space 143, method 200 continues with act 225, opening venting valve 141. After a brief fixed period, venting valve 141 is closed by act 209. In some other embodiments, venting valve 141 is held open until bubbles are no longer detected in head space 143.

Method 200 limits chemical solution 150's contact with and absorption of gases. In some embodiments, chemical solution 150 is provided in chemical solution storage containers 105 with oxygen and nitrogen concentrations substantially below their concentrations at equilibrium with ambient air. In some embodiments, supply system 101 provides chemical solution 150 to chemical solution dispensing system 160 with oxygen and nitrogen concentrations substantially and consistently below their concentrations at equilibrium with ambient air. A concentration 10% below equilibrium would be considered substantially below.

The present disclosure provides a photolithography system including a variable-volume buffer tank, a dispensing system connected to the buffer tank and configured to dispense a photolithography chemical solution from the buffer tank onto wafers, and a valve configured to release gas from a head space of the buffer tank while blocking the release of liquid from the head space. The buffer tank can be operated to provide the chemical solution to the dispensing system while keeping the chemical solution from contact with air and other gases.

The present disclosure also provides a photolithography chemical supply system that includes a storage container having an opening at the bottom and a variable-volume buffer tank coupled to the storage container through the opening at the bottom. The buffer tank has a greater storage capacity than the storage container. This system can be used to provide photolithography chemicals to the buffer tank while limiting contact between the photolithography chemicals and air or other gas while draining or otherwise remaining within the partially full storage container.

The present disclosure provides a method of supplying a chemical solution to a photolithography system. The method includes pumping the chemical solution from a variable-volume buffer tank, dispensing the pumped chemical solution in a spin-coater, and refilling the buffer tank by emptying a storage container filled with the chemical solution into the buffer tank.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photolithography system, comprising:
    a variable-volume buffer tank;
    a dispensing system connected to the variable-volume buffer tank and configured to dispense a photolithography chemical solution from the variable-volume buffer tank onto wafers; and
    a valve configured to release gas from a head space of the variable-volume buffer tank while blocking the release of liquid from the head space;
    wherein the variable-volume buffer tank includes a photolithography chemical solution inlet and a photolithography chemical solution outlet through which the photolithography chemical solution concurrently flow when being provided to the dispensing system.

2. The photolithography system of claim 1, further comprising:
    a storage container having a storage capacity volume; and
    a connector forming a connection for transferring fluid from the storage container to the photolithography chemical solution inlet of the variable-volume buffer tank;
    wherein the variable-volume buffer tank has a maximum volume that is greater than the storage capacity volume of the storage container.

3. The photolithography system of claim 2, wherein the connection for transferring fluid from the storage container to the buffer tank is configured to drain the contents of the storage container from out of the bottom of the storage container.

4. The photolithography system of claim 1, wherein the buffer tank comprises a collapsible liner within a rigid shell.

5. The photolithography system of claim 1, wherein the buffer tank comprises a piston and cylinder arrangement.

6. The photolithography system of claim 1, wherein the buffer tank comprises a flexible container with accordion pleats.

7. The photolithography system of claim 1, wherein the valve is an electronically controlled valve.

8. The photolithography system of claim 7, further comprising:
    a bubble detector configured to detect bubbles in the head space;
    wherein the valve is configured to open automatically in response to detection of bubbles in the head space by the bubble detector.

9. The photolithography system of claim 1, wherein the variable-volume buffer tank connects to the photolithography chemical solution dispensing system through an opening that exits the buffer tank at a height below the head space.

10. The photolithography system of claim 1, wherein the dispensing system comprises a positive displacement pump operative to diminish the volume of the buffer tank with each displacement cycle.

11. The photolithography system of claim 1, wherein the buffer tank comprises a pressure-regulating system.

12. The photolithography system of claim 1, wherein the photoresist chemical solution inlet opening and photoresist chemical solution outlet opening are each arranged in a sidewall of the variable-volume buffer tank, and wherein the valve is arranged above both the photoresist chemical solution inlet opening and the photoresist chemical solution output opening and configured to release the gas through a gas-vent opening arranged in an upper region of the variable-volume buffer tank.

13. A photolithography system, comprising:
a variable-volume buffer tank;
a dispensing system coupled to the variable-volume buffer tank and configured to dispense a photolithography chemical solution from the variable-volume buffer tank onto wafers;
a valve configured to release gas from a head space of the variable-volume buffer tank while blocking the release of liquid from the head space; and
a bubble detector configured to detect bubbles in the head space, and configured to selectively trigger opening of the valve based on whether bubbles are detected in the head space;
wherein the variable-volume buffer tank includes a photolithography chemical solution inlet and a photolithography chemical solution outlet through which the photolithography chemical solution concurrently flow when being provided to the dispensing system.

14. The photolithography system of claim 13, wherein the variable-volume buffer tank comprises a collapsible liner within a rigid shell.

15. The photolithography system of claim 13, wherein the variable-volume buffer tank comprises a piston and cylinder arrangement.

16. The photolithography system of claim 13, wherein the variable-volume buffer tank comprises a flexible container with accordion pleats.

17. The photolithography system of claim 13, further comprising:
a storage container having a storage capacity volume; and
a connector forming a coupling for transferring fluid from the storage container to the variable-volume buffer tank;
wherein the variable-volume buffer tank has a maximum volume that is greater than the storage capacity volume of the storage container.

18. The photolithography system of claim 17, wherein the coupling for transferring fluid from the storage container to the variable-volume buffer tank is configured to drain the contents of the storage container from out of the bottom of the storage container.

19. The photolithography system of claim 13, wherein the variable-volume buffer tank couples to the photolithography chemical solution dispensing system through an opening that exits the variable-volume buffer tank at a height below the head space.

20. A photolithography system, comprising:
a storage container having a storage capacity volume and configured to store a photolithography chemical solution;
a variable-volume buffer tank having a photolithography chemical solution inlet and a photolithography chemical solution outlet, wherein the a photolithography chemical solution inlet is configured to receive the photolithography chemical solution from the storage container through a connector, wherein the variable-volume buffer tank has a maximum volume that is greater than the storage capacity volume of the storage container;
a dispensing system coupled to the photolithography chemical solution outlet and configured to dispense a photolithography chemical solution from the variable-volume buffer tank onto wafers, wherein the photolithography chemical solution concurrently flows through the photolithography chemical inlet and the photolithography chemical solution outlet when being provided to the dispensing system; and
a valve configured to release gas from a head space of the variable-volume buffer tank while blocking the release of liquid from the head space.

* * * * *